United States Patent

Townsend

[15] 3,681,743

[45] Aug. 1, 1972

[54] ELECTRICAL CIRCUITS AND METHOD OF FABRICATION

[72] Inventor: Peter K. Townsend, New Cumberland, Pa.

[73] Assignee: AMP Incorporated, Harrisburg, Pa.

[22] Filed: July 8, 1970

[21] Appl. No.: 53,153

[52] U.S. Cl. ..............................339/218 R, 339/17 R
[51] Int. Cl. ..............................................H01r 9/08
[58] Field of Search.....339/17, 217 S, 218, 275, 276, 339/220, 91; 317/101

[56] References Cited

UNITED STATES PATENTS

| | | | |
|---|---|---|---|
| 2,369,630 | 2/1945 | Woodward | 173/363 |
| 3,072,880 | 1/1963 | Olsson | 339/217 S |
| 3,461,552 | 8/1969 | Wolf et al. | 29/626 |
| 3,551,878 | 12/1970 | Rossmann | 339/75 |
| 3,325,766 | 6/1967 | Kolb et al. | 339/18 |
| 3,441,853 | 4/1969 | Bodine | 324/158 |

OTHER PUBLICATIONS

IBM Tech. Disclosure Bul., Vol. 5, No. 5, Oct. 1962, p. 10. H. C. Schick, Component Mounting Wire Wrap

*Primary Examiner*—Marvin A. Champion
*Assistant Examiner*—Robert A. Hafer
*Attorney*—William J. Keating, Ronald D. Grefe, Gerald K. Kita, Frederick W. Raring, Jay L. Seitchik and John P. Vandenburg

[57] ABSTRACT

Electronic circuits are fabricated on circuit boards of the type on which components are mounted with leads extending generally perpendicular to and away from the board. The leads are latched under projections extending from pairs of pins. This positively locks the components in place during dip soldering. Each pin is an elongated one-piece thin metal sheet member having tabs extending from the terminal portion. The member is formed into a U-shape so that the tabs extend from the pin to form the projection under which the leads can be latched.

2 Claims, 6 Drawing Figures

ELECTRICAL CIRCUITS AND METHOD OF FABRICATION

BACKGROUND OF THE INVENTION

This invention relates to pins for electronic circuit boards, to methods of fabricating the pins, and to methods of fabricating electronic circuits on the circuit boards.

Advances in electronic circuit fabrication have included the use of miniaturized integrated circuit components, and the increased use of automated wiring.

U.S. Pat. No. 3,461,552 — Wolfe et al. shows the fabrication of an electrical circuit in which the components are placed on the board with their leads extending perpendicular to and away from the board. Opposed pairs of leads on the component are positioned between opposed pairs of pins on the circuit board. The leads are in frictional engagement with the pins to hold the component on the board during dip soldering.

SUMMARY OF THE INVENTION

In accordance with this invention the pins on electrical circuit boards have projections. When a component is placed on the circuit board, the leads, extending generally perpendicular to and away from the circuit board, are snapped under the projections on opposed pairs of pins. This gives a true mechanical lock of the component on the board whereas the friction held components of the prior art tend to slip in position during the soldering operation.

In accordance with another aspect of this invention the projections on the ends are formed by first notching both sides of the sheet metal pin to form tabs at the terminal end. Then, the pin is formed into a U-shaped channel so that the tabs form a projection.

DESCRIPTION OF A PARTICULAR EMBODIMENT

Figure 1:
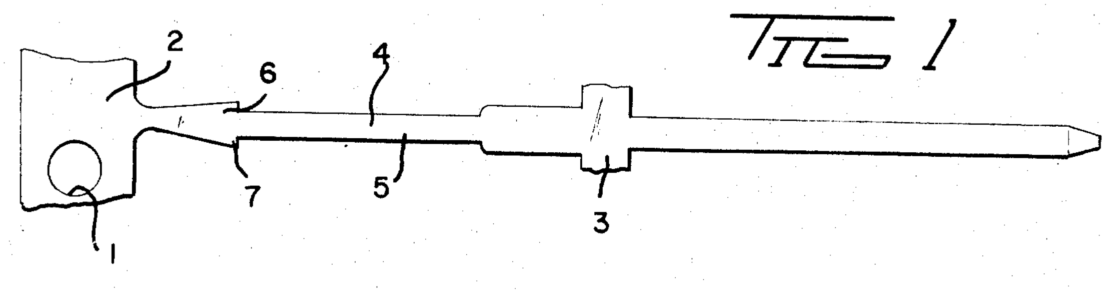
FIG. 1 shows a top view of a pin which has been die cut from sheet metal.

Referring to FIG. 1, the pins are fabricated from thin sheet metal material, approximately 0.005 inches thick in one example.

Pilot holes, including pilot hole 1, are first inserted in the stock. Then, the stock is die cut to form an elongated one-piece member joined together by the carrier strip 2 and the center strip 3.

Notches 4 and 5 are cut so that tabs 6 and 7 are formed on both sides of the member at the end adjacent to the carrier strip. By way of example, the tab extends approximately 0.009 inches from the bottom of the notch.

Figure 2:
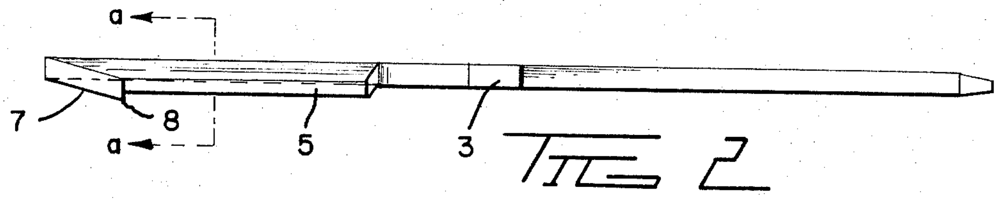
FIG. 2 is a side view of the pin after the carrier strip has been removed and the pin has been formed into a U-shaped channel.
Figures 3, 4:
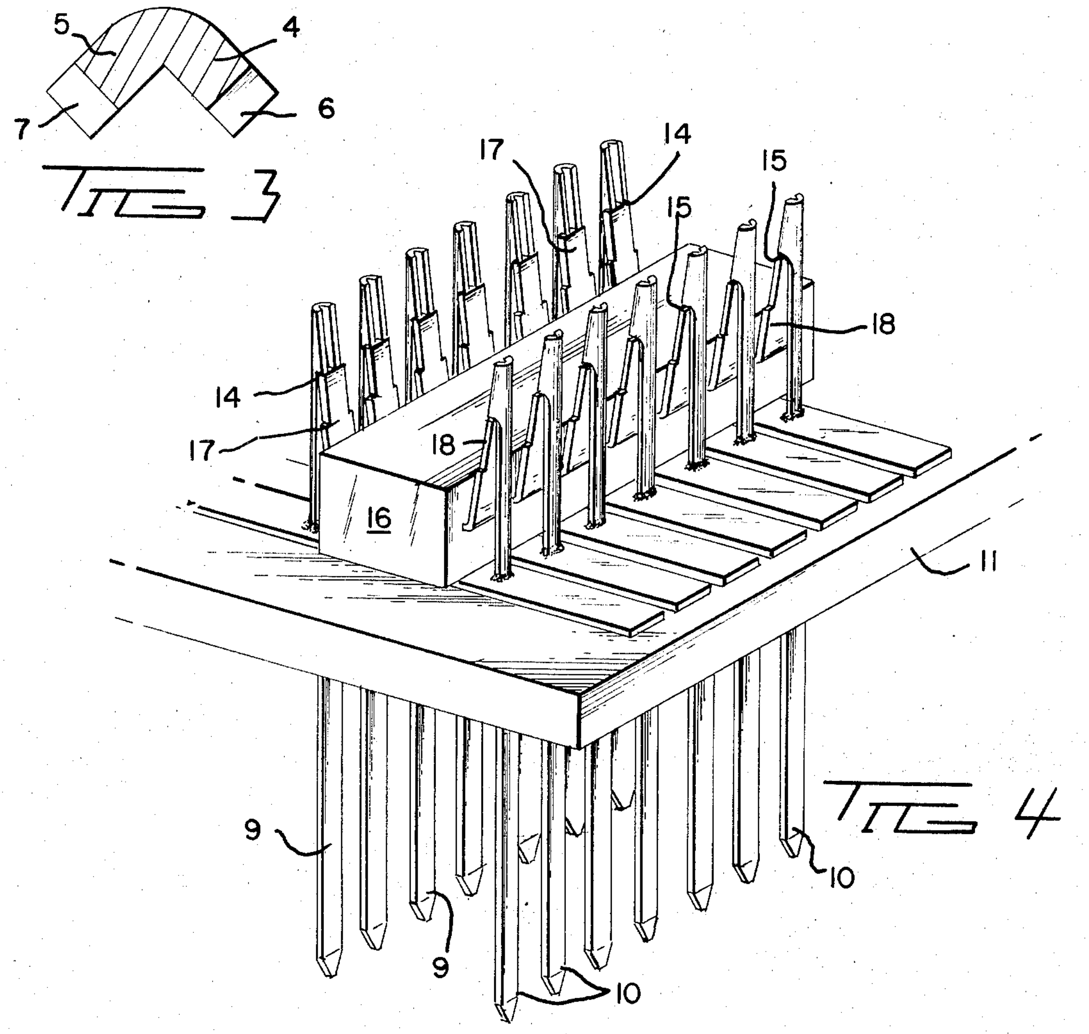
FIG. 3 is a cross-sectional view along the section *a*—-*a* of FIG. 2.
FIG. 4 is a perspective view of the circuit board, pins, and a component.

Referring to FIGS. 2 and 3, the next step is die forming the pin into generally U-shaped channel while simultaneously shearing off the carrier strip. The pins are still held together by the center strip. When the pin is formed into a U-shaped channel, the tabs 6 and 7 project from the latch. The tab 7 forms a lip at 8. This is the lip under which the component lead will be locked. A channel, indicated by the dashed line in FIG. 2, is formed down the center of the terminal portion of the pin to facilitate solder flow.

Note that the formation of the projections by die forming the pin into a U-shape actually adds mechanical strength to the pin. Forming the projections in other ways, for example by shaving material from the pin, would weaken the pin.

Figure 5:
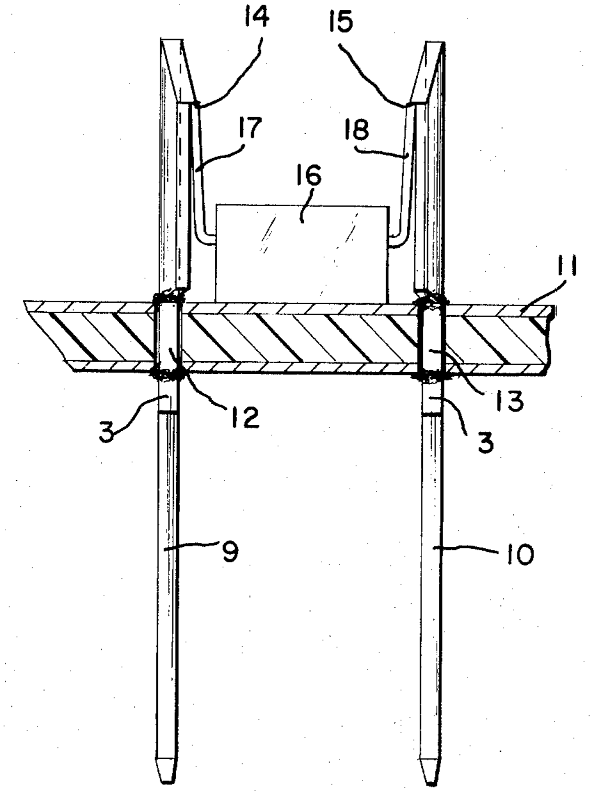
FIG. 5 shows a cross-section of the pin and an integrated circuit in place on a circuit board.

The next step is to stake the pins into a circuit board. FIGS. 4 and 5 show two pins 9 and 10 staked in the circuit board 11. The anchoring portions 12 and 13 of each pin support the pin in the board. Extending upwardly from the anchoring portions are terminal portions of the pins. The projections 14 and 15 on the pair of pins face each other to form a latch for the component leads.

Simultaneous with the staking operation, the center strip is sheared from each of the pins.

Next, the component 16 is positioned on the board with the body of the component adjacent to the board. The component includes at least a pair of leads 17 and 18. The leads 17 and 18 are snapped under the projections 14 and 15 respectively to mechanically lock the component in place on the circuit board.

Commonly, the component 16 will include a plurality of pairs of legs. Each leg is snapped under one of a pair of pins on the board. This forms a positive mechanical lock of the component to the board. Thereafter, the board can be dip soldered to permanently connect the leads to the pins. During this dip soldering there is no chance that the component will slip in position. During dip soldering normally only the terminal portion of the pins and the leads are inserted in the solder bath. This requires that the board be held upside down in a position inverted from the position shown in FIG. 4. Because of this, there would otherwise be a tendency for the component to drop out of position if it were not held in position by the projections 14 and 15.

Figure 6:
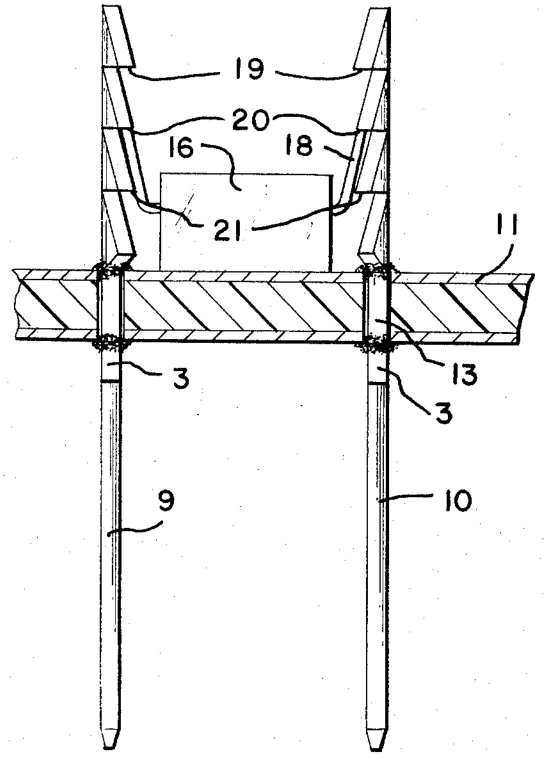
FIG. 6 shows a cross-section of an alternative embodiment of the invention.

A modification of the pin is shown in FIG. 6. Often, the lead length of the components will vary, or the manner in which the lead is bent will vary. Because of this, all leads will not latch into the projection on the corresponding pin. In FIG. 6 the pin has a number of projections 19, 20, 21, and so on. When the component 16 is being mounted on the board, the lead 18 is hooked under one of the projections. This provides a greater tolerance in lead length.

While particular embodiments have been shown and described, other modifications may be made within the true spirit and scope of the invention. The appended claims are, therefore, intended to cover all such modifications.

What is claimed is:

1. In a pin for an electronic circuit board of the type on which components are mounted with one portion thereof parallel to said board and with leads thereof extending generally perpendicular to and away from said board and extending longitudinally to a plurality of pins mounted perpendicular to said board, each pin comprising:

an elongated, one-piece, thin metal sheet member having an anchoring portion of parallelogram cross-section insertable in said board for supporting said pin in said board and a terminal portion extending from one end of said anchoring portion;

said terminal portion having spaced non-connected tabs extending laterally of the longitudinal axis thereof;

only said terminal portion being bent in generally U-shaped cross-section so that each of said tabs projects from said terminal portion and is substantially spaced longitudinally along said pin from said anchoring portion and each of said tabs is separate from each other and each forms a separate latch in spaced relationship from said board under which latches a lead of a component can be inserted to positively lock said component between said latches and said board.

2. The pin as recited in claim 1, wherein said terminal portion U-shaped cross-section defines a channel extending along the longitudinal axis thereof to aid solder flow therealong for solder connection of said terminal portion to a lead of a component mounted on said board.

* * * * *